United States Patent
Achari et al.

(10) Patent No.: US 6,168,725 B1
(45) Date of Patent: Jan. 2, 2001

(54) ETCHING OF AL-CU LAYERS TO FORM ELECTRONIC CIRCUITS USING BASE SOLUTIONS INCLUDING NITRITES, BORATES OR BROMATES

(75) Inventors: Achyuta Achari; Mohan R. Paruchuri, both of Canton, MI (US)

(73) Assignee: Visteon Global Technologies, Inc., Dearborn, MI (US)

( * ) Notice: Under 35 U.S.C. 154(b), the term of this patent shall be extended for 0 days.

(21) Appl. No.: 08/996,007

(22) Filed: Dec. 22, 1997

(51) Int. Cl.[7] ................................. C23F 1/02; H05K 3/06
(52) U.S. Cl. .......................... 216/13; 216/102; 216/105; 252/79.5
(58) Field of Search ................... 216/102, 105, 216/13; 252/79.5

(56) References Cited

U.S. PATENT DOCUMENTS

| | | | |
|---|---|---|---|
| 3,802,973 | * 4/1974 | Smith | 252/79.5 |
| 3,810,797 | 5/1974 | Schaffstall et al. | |
| 3,957,553 | 5/1976 | Smith. | |
| 4,028,205 | * 6/1977 | Dorsey, Jr. | 204/181 |
| 4,098,712 | * 7/1978 | Ikeda et al. | 252/79.5 |
| 4,349,411 | 9/1982 | Okinaka. | |
| 4,372,805 | * 2/1983 | Takahashi | 156/642 |
| 4,588,474 | 5/1986 | Gross. | |
| 5,091,046 | 2/1992 | Hunter et al. | |
| 5,689,879 | * 11/1997 | Urasaki et al. | 29/846 |

FOREIGN PATENT DOCUMENTS

| | | |
|---|---|---|
| 34 05 437 | 10/1984 | (DE). |
| 233 592 | 3/1986 | (DE). |
| 2 195 701 | 3/1974 | (FR). |
| 913 343 | 12/1962 | (GB). |
| 361261484A | * 11 1986 | (JP) ........................ 216/13 |

OTHER PUBLICATIONS

WERNICK et al., "The Surface Treatment and Finishing of Aluminum and its Alloys", Finishing Publications Ltd., 1987, pp. 190–219.*

* cited by examiner

Primary Examiner—Richard Bueker
Assistant Examiner—Alva C. Powell
(74) Attorney, Agent, or Firm—Leslie C. Hodges

(57) ABSTRACT

The invention is an aluminum etchant and method for chemically milling aluminum from, according to a preferred embodiment, a copper-aluminum-copper tri-metal layer to form three-dimensional circuits. The tri-metal comprises copper circuit patterns present on opposing surfaces of an aluminum foil, one of the copper patterns being laminated on a substrate. The etchant comprises an aqueous solution of 60 to 500 g/l base selected from (a) sodium hydroxide, (b) potassium hydroxide, and (c) their mixture; and 30 to 500 g/l of an additive selected from nitrite salt, a borate salt, a bromate salt, or mixture of any of them. The method comprises contacting the tri-metal with the etchant at a temperature between 25 and 95° C. for a time sufficient to remove a desired amount of the aluminum layer and provide (rigid, flexible, or 3-dimensional) electronic circuitry which may contain multiple conductive circuit layers.

9 Claims, 1 Drawing Sheet

ETCHING OF AL-CU LAYERS TO FORM ELECTRONIC CIRCUITS USING BASE SOLUTIONS INCLUDING NITRITES, BORATES OR BROMATES

Reference is made to related U.S. patent application Ser. No. 08/955,449 filed Dec. 22, 1997 and entitled "ETCHING TRI-METAL LAYERS TO FORM ELECTRONIC CIRCUITS USING AQUEOUS ALKALINE SOLUTIONS INCLUDING NITRATES", being commonly assigned herewith.

FIELD OF THE INVENTION

The present invention relates to an etchant and a method for chemically milling electronic circuitry (rigid/flex or 3-dimensional circuitry) comprising copper on aluminum foil laminated to a substrate using an alkaline aqueous solution containing a nitrite, borate or bromate salt to selectively etch out the aluminum.

BACKGROUND OF THE INVENTION

It has been suggested that the complexity and weight of electronic component designs in automotive vehicles can be improved by assembling the electronic components on substrates, e.g., on the underside of vehicle dashboards. This type of system has been termed Instrument Panel (IP) Super-Integration. In this system, it is intended that individual electronic circuit boards be first assembled on substrates, with electronic components attached thereupon. Currently used conventional printed circuit board technologies utilize either additively or subtractively defined copper, a dielectric laminate and plated through hole for interconnection. One of the drawbacks of this method is that it is expensive.

Another way is being explored by the inventors to provide three-dimensional circuits for use as part of Super-Integration Systems. It involves forming interconnected electronic substrates through the preferential chemical etching of a tri-metal layers of dissimilar metals. That is, copper patterned circuit images are carried on both sides of an aluminum foil. This copper-aluminum-copper tri-layer metal system could be made by cladding, lamination, or plating of copper followed by selective etch of copper to form the copper patterns on both sides of the aluminum foil. After the tri-metal is laminated on a polymeric substrate as by means of an adhesive, it needs to be selectively etched to remove the aluminum and form an electronic circuit board. Alternately, copper patterns could be selectively electroplated on both sides of an aluminum foil, with or without a seed layer, and then after lamination of one of the copper patterns on a substrate, the aluminum would be selectively etched away to form an electronic circuit board. One of the advantages of this Cu—Al—Cu construction is the ability to have higher density circuit patterns by providing cross-overs of Cu-tracks. In addition, this new technique is seen capable of providing better heat dissipation through the aluminum interlayer.

In order to obtain the desired circuit pattern of such a Cu—Al—Cu construction, the aluminum needs to be selectively etched away. To provide durable circuits, it is necessary to control the etching of the aluminum carefully to have optimum undercut. Sodium hydroxide solutions have been long used to etch aluminum. Attempts at etching the tri-metal Cu—Al—Cu described above with a conventional sodium hydroxide solution was found by the inventor, however, to result in an unacceptably large degree of undercutting of the aluminum as shown in FIG. 1. This is believed by the inventor to be based on the difference in electrochemical potential between aluminum and copper which unfavorably enhances aluminum etching rates in areas adjacent to the copper in this solution. The undercut of the aluminum was found to be so high, that the copper pads are lifted. I have now unexpectedly found a way to overcome the undercut problems associated with such chemical etching of aluminum for tri-metal Cu—Al—Cu laminates which manufactures durable chemically milled circuits. This process involves the selective etching of the tri-metal with a particularly defined alkaline etchant solution of sodium or potassium hydroxide which includes defined amounts of nitrites, borates (perborates or tetraborates), bromates at a given temperature.

Several patents were identified after invention which disclose etchants for preparing aluminum surfaces. U.S. Pat. No. 3,957,553 discloses an alkaline etching bath for aluminum to improve its appearance and prepare it for subsequent treatment. The bath comprises an alkali metal hydroxide (15–200 g/l), a chelating agent (0.5–15 g/l) like sorbitol for suppressing alumina precipitation during etching, and an oxidizing agent (0.0001–1 g/l) such as borates or bromates. U.S. Pat. No. 5,091,046 discloses a process for caustic etching of aluminum to obtain a matte finish with a solution containing free sodium hydroxide and dissolved aluminum in a 0.6-2.1 ratio and an etch equalizing agent at a temperature above about 70° C. The latter patent discloses total sodium hydroxide concentrations of 40–120 g/l and includes equalizing (oxidizing) agents such as sodium nitrate (up to 50 g/l), sodium nitrite (up to 20 g/l), sodium sulfide. These etching solutions have the drawbacks that they would have an undesirable low etching rate and high Aluminum undercut with the Cu—Al—Cu tri-metals and would attack plastic at temperatures above 70° C. It would be desirable to have an etching solution and method for etching the tri-metal which would selectively etch out a portion of the aluminum while leaving sufficient aluminum with low undercut to provide a structurally sound electronic circuitry, e.g., 3-dimentional circuits. And the etching should take place at a commercially acceptable rate. The present invention provides such an etchant and method of etching out the aluminum.

DISCLOSURE OF THE INVENTION

The invention is an etchant and method useful for selectively etching aluminum from, according to one embodiment, copper-aluminum-copper tri-metal layers which comprise copper circuit patterns present on opposing surfaces of an aluminum foil, one of the copper patterns being laminated onto a substrate. The etchant comprises an aqueous solution of: (1) 60 to 500 g/l base selected from (a) sodium hydroxide, (b) potassium hydroxide, and (c) their mixture; and (2) 30 to 500 g/l of a nitrite salt, a borate salt, a bromate salt, or a mixture of any of them. According to one embodiment of the method, the tri-metal laminate is contacted with the etchant disclosed above at a temperature of 25 and 95° C. and for a time sufficient to selectively remove a desired amount of the aluminum layer and form electronic circuitry which contains multiple conductive copper circuit layers. While this invention is particularly useful for tri-metal etching as described above, this invention etchant can also be used to etch out aluminum from tri-metals not involved with electronic circuitry or any other surface finishing applications such as for weight reduction of aluminum components in the aerospace industry. In addition, the present invention etchant and method can more generally be used to etch out aluminum from a copper-aluminum configuration laminate, i.e., where the a copper pattern is provided on an aluminum layer, the aluminum layer being laminated to a substrate, to form electronic circuitry.

Advantageously, the present invention etchant and method provides for fast and uniform etching of the multiple layer Cu—Al—Cu or Al—Cu electronic circuitry disclosed above. That is the present invention etchant solution has an etch rate almost twice as fast as conventional sodium hydroxide etchants which results in lower manufacturing costs, while at the same time avoids causing the undesirable undercutting of the Aluminum layer as was the case with conventional sodium hydroxide etchants. The optimal ratio of the downward cut to horizontal cut during etching is about 1:1 which generally takes place in the present invention method as shown in FIG. 2.

Further we have advantageously found that the etchant solutions of the present invention leave the copper surfaces clean, i.e., they are not oxidized or corroded, thus eliminating the need for a follow-up cleaning process. In addition, preferred invention etchant solutions disclosed herein containing sodium hydroxide, sodium nitrite, sodium borate (perborate or tetraborate) or sodium bromate are relatively inexpensive, readily available, and easily treated and disposed of which enhances the advantage of the present invention method using this new etchant. This new invention makes manufacturing of Etchted Tri-layer Metal (ETM) circuitry more commercially feasible, which circuitry is considered to be optimal for use in the Super Integration of interior automotive subsystems.

DETAILED DESCRIPTION OF PREFERRED EMBODIMENTS

Figure 1:
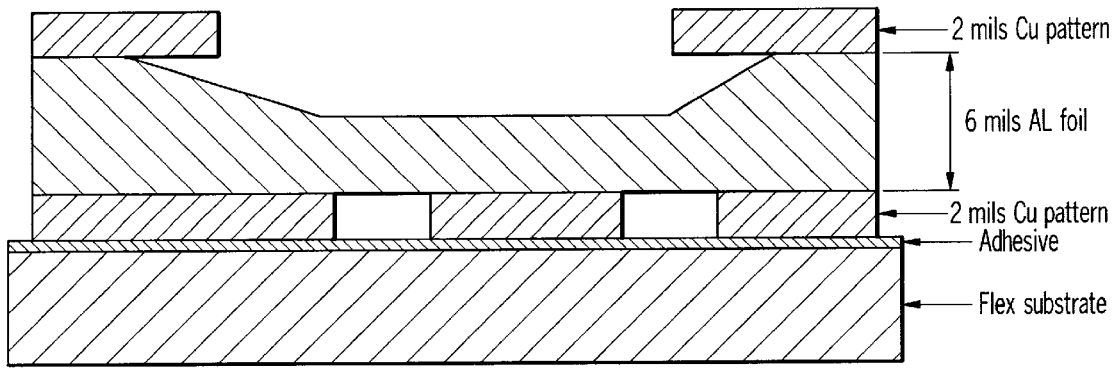
FIG. 1 is a schematic of a comparative example etching of a tri-metal of copper patterned on two sides of aluminum foil and adhered to a flexible substrate etched in an aqueous NaOH solution.
Figure 2:
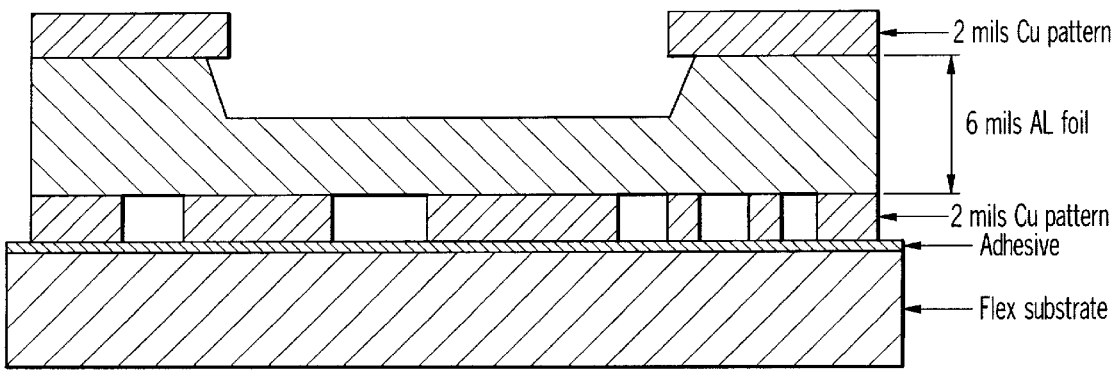
FIG. 2 is a schematic of an example of etching a tri-metal according to embodiments of the present invention using an aqueous alkaline solution of borate salts.

The inventor has unexpectedly found a novel and commercially desirable way to manufacture multiple layer copper circuits adhered to a substrate. As disclosed above, on embodiment of the method is carried out by selectively etching aluminum from a tri-metal of copper-aluminum-copper with a novel etchant solution which avoids causing any serious undercut problems. In the present invention ETM method, one embodiment comprises etching the aluminum from an aluminum foil where copper circuits have been provided on opposing surfaces of the aluminum foil.

As discussed above, we found that etching aluminum when it adjoins a metal of different potential, like copper, can be problematic. That is, using a conventional sodium hydroxide etching solution causes serious undercut problems when too much of the aluminum is removed underneath the copper circuits. We have found that by adding nitrite, borate or bromate salts to the aqueous alkaline solution in specified amounts and using the etchant solution at a chosen temperature, these undercut problems are significantly minimized while providing faster etching. We believe that this problem of undercutting is tied to the evolution of hydrogen gas at the copper/aluminum interface during etching. We believe that the agitation produced at the interface by the gas evolution results in undesirable undercut. We found that by adding nitrite, borate or bromate salts or a mixture of any of them to the bath in specific amounts and having the etching solution at a given temperature, the gas evolution is reduced and the aluminum undercutting is significantly lessened. That is the aluminum etching laterally is lessened while increasing the etching of the aluminum in the vertical direction. Neither the validity nor the understanding of this theory, however, is necessary for the practice of the present invention method.

The copper-aluminum-copper layers being chemically milled according to one embodiment of the present invention are made of an aluminum foil with copper patterns on the both sides, one of the copper patterns being laminated on a substrate. The way in which this tri-metal is made is not critical to the present invention. One way to make this copper-aluminum-copper tri-metal is by first depositing and developing a photo-resist on both sides of a copper-aluminum-copper foil as could be made by cladding, lamination, or plating. This then could be followed by selectively etching the copper to form copper patterns on both sides of the aluminum foil. Thereafter, before etching out the aluminum to form the electronic circuitry, one of the copper patterns is laminated on rigid/flex substrate as by using an adhesive. Another method to make this tri-metal of copper-aluminum-copper using a photo-resist image on both sides of an aluminum foil, with or without a seed layer of other metal, followed by selectively electroplating copper patterns on both sides of the aluminum foil. Then the photo-resist would be removed and one of the copper patterns laminated on a substrate to form a tri-metal circuit of copper-aluminum-copper after aluminum etching. As disclosed above, a laminate of a copper circuit on aluminum foil can also be laminated to a substrate and etching carried out using the invention etchant. The substrate can be rigid or flexible depending on the thickness, for example, a polymeric material like plastic, FR-4 (fiber reinforced resin) or a metal with a coating of a plastic. Neither the particular design of the circuitry on the aluminum foil nor the method by which it is produced, nor the particular substrate to which it is laminated, is critical to the practice of the invention etching method.

The etchant solution used herein comprises 60 to 500 g/l base selected from (a) sodium hydroxide, (b) potassium hydroxide, and (c) their mixture and an additive of nitrites, borates, bromates and a mixture of any of them as disclosed above. Preferably, the concentration of base is 150 to 250 g/l. The base is most preferably sodium hydroxide. The optimal concentration of base and one of nitrite/borate/bromate salt depends on several factors including desired etching rate and undercut. The salts, in total, are used in amounts of 30 to 500 g/l, more preferably being 40 to 160 g/l. The nitrites, borate or bromate salt or their mixture when used in these amounts was unexpectedly found to allow the uniform etching of the aluminum from the (di-metal) or the preferred tri-metal configuration to maintain the integrity of the final (rigid, flex, or three-dimensional) circuitry as explained above. The nitrite, borate or bromate salt dissolved in the etching solution may be any nitrite, borate or bromate salts including, but not limited to, such salts of metals like sodium e.g., sodium nitrite, potassium, iron (e.g., ferric borate), manganese, zinc, lithium, silver, calcium, ammonium, cobalt (e.g., cobaltous borate), copper (e.g., cupric borate), aluminum, mercury (e.g., mercuric borate), thorium, barium, guanidine, lead, cerium, bismuth, zirconium, strontium, cadmium, lanthanum, nickel (e.g., nicklous borate), and mixtures of any of them. The particularly preferred nitrites, borates and bromates are those of sodium and potassium because both of them have lower cost relative to other salts. The borate salts are more preferred than the bromate salts because borate has lower cost and is more environmentally desirable than bromates. Nitrite salts have the drawback that ammonia gas may be generated.

The alkaline aqueous aluminum etchant solution of the present invention can be used to etch the aluminum by any convenient method, including dip etching and spray etching of the laminate.

To form the etchant solution, the nitrite, borate, bromate salts or mixture of any of them generally would be added into the alkaline aqueous solution at room temperature or at an elevated temperature which facilitates dissolution. Tri-metal (or bi-metal) laminated layers of copper-aluminum-copper (or copper-aluminum), as disclosed herein, are then contacted with the etchant solution for a time sufficient to etch out the aluminum in the desired amount. The etchant solution is at a temperature of 25 to 95° C., more preferably being 40 to 65° C., most preferably being 45° C. to 55° C. Selection of optimal base, nitrites, borates or bromates and their concentration, as well as etchant temperature and etch time, would be within the skill of one in the art in view of the present disclosure. Factors to be taken in consideration in choosing the etchant temperature include, e.g., desired etching rate, desired undercut, and the propensity of the etchant to attack the adhesive or substrate. The aluminum concentration in the etchant solution can be varied to optimize etching rate and undercut as would be apparent to those skilled in the art in view of the present disclosure.

The following examples show that the change of the aluminum undercut and etching time with the concentration of sodium hydroxide (NaOH), sodium perborate (NaBO3), sodium tetraborate (Na2B4O7) and sodium bromate (NaBrO3) in the alkaline aqueous solutions. Examples 1–12 show that sodium hydroxide concentration should be above 5 wt. % (50 g/l) to give desirable undercut of about 6 mils for 6 mils thick aluminum. Examples 13–21 show that the etching rate (time to remove 6 mils thick aluminum) is faster and stable only above 2 wt. % (20 g/l) of perborate, tetraborate or bromate. So, the minimum concentration of sodium hydroxide is 60 g/l and that of borates or bromates is 30 g/l and the maximum concentration depends on the acceptable etching rate since etching rate goes down at higher concentrations generally.

In the case of sodium nitrite, etch rate is decreased below 40 g/l and above 160 g/l.

EXAMPLES 1–12

| Example | Etchant | Temp. (° C.) | Average undercut (mil) |
|---|---|---|---|
| 1 | 10 wt % NaBO$_3$ + 5 wt % NaOH | 55 | 7.2 |
| 2 | 10 wt % NaBO$_3$ + 10 wt % NaOH | 55 | 6.4 |
| 3 | 10 wt % NaBO$_3$ + 15 wt % NaOH | 55 | 5.9 |
| 4 | 10 wt % NaBO$_3$ + 20 wt % NaOH | 55 | 6.0 |
| 5 | 10 wt % Na$_2$B$_4$O$_7$ + 5 wt % NaOH | 55 | 7.0 |
| 6 | 10 wt % Na$_2$B$_4$O$_7$ + 10 wt % NaOH | 55 | 6.5 |
| 7 | 10 wt % Na$_2$B$_4$O$_7$ + 15 wt % NaOH | 55 | 6.2 |
| 8 | 10 wt % Na$_2$B$_4$O$_7$ + 20 wt % NaOH | 55 | 6.3 |
| 9 | 10 wt % NaBrO$_3$ + 5 wt % NaOH | 55 | 6.8 |
| 10 | 10 wt % NaBrO$_3$ + 10 wt % NaOH | 55 | 6.3 |
| 11 | 10 wt % NaBrO$_3$ + 15 wt % NaOH | 55 | 5.9 |
| 12 | 10 wt % NaBrO$_3$ + 20 wt % NaOH | 55 | 5.8 |

EXAMPLES 13–21

| Example | Etchant | Temperature (° C.) | Time* |
|---|---|---|---|
| 13 | 2 wt % NaBO$_3$ + 20 wt % NaOH | 55 | 14.5 |
| 14 | 5 wt % NaBO$_3$ + 20 wt % NaOH | 55 | 12.5 |
| 15 | 10 wt % NaBO$_3$ + 20 wt % NaOH | 55 | 11.5 |
| 16 | 2 wt % Na$_2$B$_4$O$_7$ + 20 wt % NaOH | 55 | 14.0 |
| 17 | 5 wt % Na$_2$B$_4$O$_7$ + 20 wt % NaOH | 55 | 11.5 |
| 18 | 10 wt % Na$_2$B$_4$O$_7$ + 20 wt % NaOH | 55 | 11.5 |
| 19 | 2 wt % NaBrO$_3$ + 20 wt % NaOH | 55 | 14.5 |
| 20 | 5 wt % NaBrO$_3$ + 20 wt % NaOH | 55 | 11.5 |
| 21 | 10 wt % NaBrO$_3$ + 20 wt % NaOH | 55 | 11.0 |

*to dissolve 6 mils Al (min) - in all examples

We claim:

1. A method for chemically milling aluminum from copper-aluminum-copper tri-metal layers, the method comprising the steps of:
   providing a tri-metal laminate having layers of copper-aluminum-copper having copper circuit patterns present on opposing surfaces of an aluminum foil, and
   contacting the tri-metal laminate with an etchant comprising an aqueous solution of: (1) 60 to 500 g/l base selected from the group consisting of sodium hydroxide, potassium hydroxide, and mixtures thereof; and (2) 30 to 500 g/l of a salt selected from the group consisting of nitrite salt, borate salt, bromate salt, and mixtures thereof at a temperature of 25 to 95° C. for a time sufficient to selectively remove a desired amount of the aluminum layer and form a electronic circuitry which contains multiple conductive copper circuit layers.

2. The method according to claim 1 wherein said is a salt of a metal selected from the group consisting of sodium, potassium, iron, manganese, zinc, lithium, silver, calcium, ammonium, cobalt, copper, aluminum, mercury, thorium, barium, guanidine, lead, cerium, bismuth, zirconium, strontium, cadmium, lanthanum, nickel, and mixtures thereof.

3. The method according to claim 1 wherein said etchant is used at a temperature of 40 to 65° C.

4. The method according to claim 1 wherein said method comprises dipping said tri-metal laminate in said etchant.

5. The method according to claim 1 wherein said method comprises spraying said tri-metal laminate with said etchant.

6. The method according to claim 1 wherein said etchant comprises 150 to 250 g/l of said base.

7. The method according to claim 1 wherein said etchant comprises 40 to 160 g/l of said salt.

8. The method according to claim 1 wherein said etchant is used at a temperature of 45–55° C.

9. A method for chemically milling aluminum from copper-aluminum layers, the method comprising the steps of:
   providing a metal laminate of copper-aluminum having copper circuit patterns present on an aluminum foil, and
   contacting the metal laminate with an etchant comprising an aqueous etching solution of: (1) 60 to 500 g/l of a base selected from the group consisting of sodium hydroxide, potassium hydroxide, and mixtures thereof; and (2) 30 to 500 g/l of a salt selected from the group consisting of nitrite salt, borate salt, bromate salt, and mixtures thereof at a temperature of 25 and 95° C. for a time sufficient to remove a desired amount of the aluminum layer and form a circuit board which contains a conductive copper circuit layer.

* * * * *